United States Patent
Kim et al.

(10) Patent No.: US 8,916,973 B1
(45) Date of Patent: Dec. 23, 2014

(54) SEMICONDUCTOR DEVICE WITH ELECTRODE STRUCTURE INCLUDING GRAPHENE PATTERN FORMED OVER METAL PATTERN

(71) Applicant: SK hynix Inc., Gyeonggi-do (KR)

(72) Inventors: Eun Seon Kim, Gyeonggi-do (KR);
Jung Won Seo, Gyeonggi-do (KR); Jin Ha Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/076,889

(22) Filed: Nov. 11, 2013

(30) Foreign Application Priority Data

Aug. 20, 2013 (KR) .......... 10-2013-0098623

(51) Int. Cl.
*H01L 45/00* (2006.01)
*H01L 23/34* (2006.01)
(52) U.S. Cl.
CPC .......... *H01L 45/126* (2013.01); *H01L 45/1616* (2013.01); *H01L 23/345* (2013.01)

USPC .......................................................... 257/750
(58) Field of Classification Search
CPC .................................................... H01L 45/128
See application file for complete search history.

(56) References Cited

U.S. PATENT DOCUMENTS

| | | | |
|---|---|---|---|
| 7,808,816 B2 * | 10/2010 | Tanaka et al. ................ | 365/163 |
| 2012/0086132 A1 * | 4/2012 | Kim et al. ................... | 257/774 |
| 2014/0070425 A1 * | 3/2014 | Wada et al. .................. | 257/774 |

FOREIGN PATENT DOCUMENTS

KR 1020130006873 1/2013

* cited by examiner

*Primary Examiner* — Stephen W Smoot
(74) *Attorney, Agent, or Firm* — IP & T Group LLP

(57) ABSTRACT

A semiconductor device includes a data storage layer formed over a semiconductor substrate in which a lower structure is formed, and an electrode structure formed on at least one side of the data storage layer over the semiconductor substrate. The electrode structure includes a metal pattern, and a graphene pattern formed over the metal pattern.

5 Claims, 6 Drawing Sheets

US 8,916,973 B1

SEMICONDUCTOR DEVICE WITH ELECTRODE STRUCTURE INCLUDING GRAPHENE PATTERN FORMED OVER METAL PATTERN

CROSS-REFERENCES TO RELATED APPLICATION

This application claims priority under 35 U.S.C. 119(a) to Korean application No. 10-2013-0098623, filed on Aug. 20, 2013, in the Korean intellectual property Office, which is incorporated by reference in its entirety as set forth in full.

BACKGROUND

1. Technical Field

Various embodiments of the inventive concept relate to a semiconductor device including a variable resistance device having a switching characteristic between different resistance states, and a method of fabricating the same.

2. Related Art

In recent years, semiconductor devices configured to store information in various electronic apparatuses such as computers and portable communication apparatuses are required according to miniaturization, low power, high performance, and diversification of the electronic apparatuses, and the semiconductor devices have been actively studied to meet those demands.

Among those semiconductor devices, there are semiconductor devices configured to store data in a data storage layer using a characteristic switched between different resistance states according to an applied voltage or current. The semiconductor devices using such a switching characteristic may include resistive random access memories (ReRAMs), phase-change RAMs (PCRAMs), ferroelectric RAMs (FRAMs), magnetic RAMs (MRAMs), E-fuses, and the like.

Such a semiconductor device includes an electrode configured to apply a voltage or current to the data storage layer, and aluminum (Al) or tungsten (W) having excellent electrical conductivity has been mainly used as the electrode. In recent years, studies for using copper (Cu) having better electrical conductivity and lower resistance than aluminum (Al) or tungsten (W) as the electrode have been widely conducted.

However, as an area of the semiconductor device becomes shrunk, even when copper (Cu) is used as a material for the electrode, a mat size of a cell array is reduced due to increase in metal resistance, and thus a cell efficiency is reduced.

Further, as the area of the semiconductor device is shrunk, adjacent cells as well as a selected cell are affected when storing data by applying a voltage or current to a data storage layer of the selected cell among a plurality of cells in the semiconductor device.

Therefore, a method for reducing metal resistance and a method for preventing adjacent cells from being affected in a process of storing data in a selected cell are required in the recent semiconductor devices.

SUMMARY

Various exemplary embodiments are provided to a semiconductor device capable of reducing resistance of an electrode.

Other exemplary embodiments are provided to a semiconductor device capable of preventing adjacent cells from being affected in a process of storing data in a selected cell.

According to an exemplary embodiment, there is provided a semiconductor device. The semiconductor device may include a data storage layer formed over a semiconductor substrate in which a lower structure is formed, and an electrode structure formed on at least one side of the data storage layer over the semiconductor substrate. The electrode structure may include a metal pattern, and a graphene pattern formed over the metal pattern.

According to an exemplary embodiment, there is provided a method of fabricating a semiconductor device. The method may include providing a semiconductor substrate in which a lower structure is formed, and forming an electrode structure over the semiconductor substrate. The forming an electrode structure may include forming a metal pattern over the semiconductor substrate, and forming a graphene pattern over the metal pattern.

According to an exemplary embodiment, there is provided a method of fabricating a semiconductor device. The method may include forming a data storage layer over a substrate in which a lower structure is formed, and forming an electrode structure on at least one side of the data storage layer over the substrate, wherein the electrode structure includes a metal pattern and a graphene pattern formed over the metal pattern.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
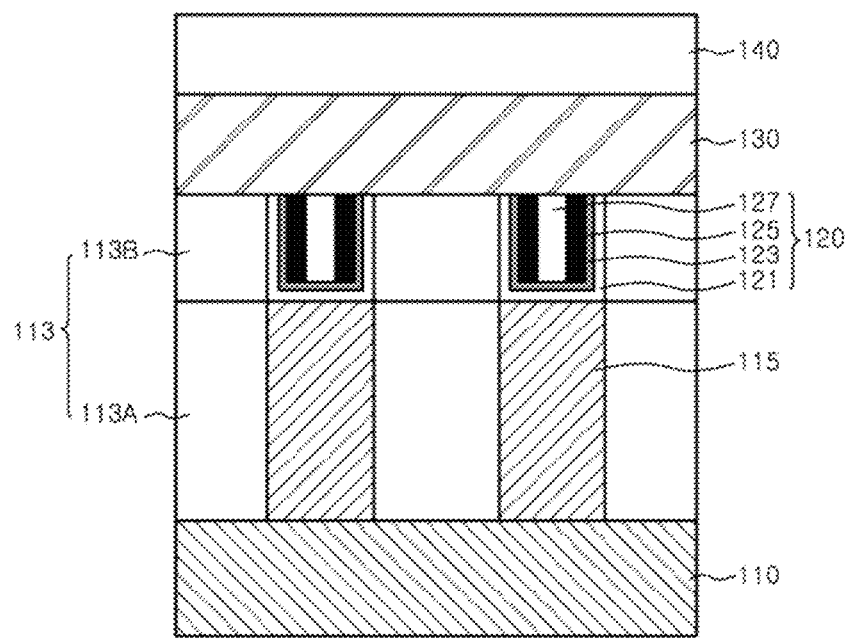
FIG. 1 is a cross-sectional view illustrating a semiconductor device according to an exemplary embodiment of the inventive concept.

Hereinafter, exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Various embodiments of the inventive concept are described herein with reference to cross-section and/or plan illustrations that are schematic illustrations of idealized embodiments of the inventive concept. However, embodiments of the inventive concept should not be construed as limited to the inventive concept. Although a few embodiments of the inventive concept will be shown and described, it will be appreciated by those of ordinary skill in the art that changes may be made in these exemplary embodiments without departing from the principles and spirit of the inventive concept.

A semiconductor device according to an exemplary embodiment of the inventive concept may include a variable resistance device. Here, the variable resistance device may have a variable resistance characteristic, and include a single layer or multiple layers. For example, the variable resistance device may include a material used in a ReRAM, a PCRAM, MRAM, FRAM, and the like, for example, a chalcogenide-based compound, a transition metal compound, ferroelectric, ferromagnetic, or the like. However, the inventive concept is not limited thereto, and the variable resistance device may have any variable resistance characteristic in which the variable resistance device is switched between different resistance states according to a voltage or current applied to both ends thereof.

Specifically, the variable resistance device may include metal oxide. The metal oxide may be transition metal oxide such as nickel oxide, titanium oxide, hafnium oxide, zirconium oxide, tungsten oxide, or cobalt oxide, a perovskite-based material such as SrTiO (STO) or PrCaMnO (PCMO), or the like. The variable resistance device may have a switching characteristic in which the variable resistance device is switched between the different resistance states through generation/extinction of a current filament by a vacancy behavior.

The variable resistance device may include a phase-change material. For example, the phase-change material may be a chalcogenide-based material such as germanium-antimony-tellurium (Ge—Sb—Te: GST). The variable resistance device may be stabilized to any one of a crystalline state and an amorphous state by a heat and have a switching characteristic between the different resistance states.

The variable resistance device may include a structure in which a tunnel barrier layer is interposed between two magnetic layers. The magnetic layers may be formed of a material such as NiFeCo or CoFe. The tunnel barrier layer may be formed of a material such as $Al_2O_3$. The variable resistance device may have a switching characteristic in which the variable resistance device is switched between different resistance states according to magnetization directions of the magnetic layers. For example, the variable resistance device may be in a low resistance state when the magnetization directions of two magnetic layers are parallel, and a high resistance state when the magnetization directions of the two magnetic layers are anti-parallel.

In exemplary embodiments of the inventive concept, a PCRAM among semiconductor devices will be exemplified and described. The semiconductor device according to an exemplary embodiment of the inventive concept includes a semiconductor substrate in which a lower structure is formed, a data storage layer such as a phase-change material pattern formed on the lower structure, and an electrode structure formed in at least one side of the data storage layer. In the inventive concept, various exemplary embodiments may be implemented according to a location of the electrode structure, and hereinafter, the exemplary embodiments according to the location of the electrode structure will be described in detail.

FIG. 1 is a cross-sectional view illustrating a semiconductor device according to an exemplary embodiment of the inventive concept.

Referring to FIG. 1, the semiconductor device according to the exemplary embodiment of the inventive concept includes a semiconductor substrate 110 in which a lower structure including a word line (not shown) and a switching device 115 is formed, and a lower electrode 120, a data storage layer such as a phase-change material pattern 130, and an upper electrode 140, which are sequentially formed on the switching device 115.

The lower electrode 120 may be disposed in a hole formed by patterning an interlayer insulating layer 113 formed on the semiconductor substrate 110 and the switching device 115. In the exemplary embodiment, the interlayer insulating layer 113 may include a first interlayer insulating layer 113A and a second interlayer insulating layer 113B formed on the first interlayer insulating layer 113A, and the hole is formed in the second interlayer insulating layer 113B. A top surface of the switching device 115 is exposed by the hole.

Specifically, the lower electrode 120 may include an electrode structure including a first metal pattern 121 formed on the switching device 115, a first graphene pattern 123 formed on the first metal pattern 121, a heating pattern 125 disposed on sidewalls of the first graphene pattern 123, and an insulating layer 127 buried in the heating pattern 125.

The first metal pattern 121 may be formed of a copper (Cu) material having excellent electrical conductivity and low resistance. The first metal pattern 121 formed of the Cu material may be formed along a surface of the hole in a cylindrical shape in which a top at a side in contact with the phase-change material pattern 130 is opened to confine the heating pattern 125 in the hole as illustrated in FIG. 1. (Hereinafter, such a cylindrical shape is referred to as a 'top-opened cylindrical shape'.)

The first graphene pattern 123 may be formed along a surface of the first metal pattern 121 of the Cu material by a chemical vapor deposition (CVD) method. That is, the first graphene pattern 123 may be formed along sidewalls and a bottom of the first metal pattern 121 having the top-opened cylindrical shape to substantially confine the heating pattern 125 in the hole.

Graphene composing the first graphene pattern 123 is generally a material having high charge mobility and high thermal conductivity. The graphene is a term created by combining "graphite" and a chemical suffix "ene" which means a molecule having a carbon double bond, and the graphene is a material having a honey comb-shaped two-dimensional plane structure in which carbons are connected in a hexagonal shape.

The graphene has a charge mobility value of far above 200,000 $cm^2/Vs$, and may be widely used in an ultra-high speed transistor.

The following Table shows thermal conductivity of a metal and a coating material containing graphene.

TABLE

| Metal/Coating Material | Thermal conductivity(W/(m*K)) |
| --- | --- |
| Graphene | (4840 ± 440)~(5300 ± 480) |
| Carbon nanotube (SW) | 3500 |
| Carbon nanotube (MW) | 3180 |
| Diamond (natural) | 2200 |
| Silver | 429 |
| Copper | 401 |
| Gold | 318 |
| Aluminum | 237 |
| Lead | 35.3 |
| Stainless steel | 12.11~45.0 |
| Ice | 2 |
| Concrete, Stone | 1.7 |
| Soil | 1.5 |

TABLE-continued

| Metal/Coating Material | Thermal conductivity(W/(m*K) |
|---|---|
| Glass | 1.1 |
| Water (liquid) | 0.6 |
| Epoxy(silica-filled) | 0.3 |
| Rubber | 0.16 |
| TiAlN(75:25) | 0.05 |
| TiAlN(50:50) | 0.07 |

That is, as shown in Table, the thermal conductivity of the graphene is larger than that of a carbon nanotube, which is known to be the most superior in terms of thermal conductivity, and the graphene has excellent heat dissipation.

The heating pattern 125 may be formed of a material having high electrical conductivity and high thermal conductivity such as titanium tungsten (TiW), titanium aluminum nitride (TiAlN), titanium nitride (TiN), and tungsten nitride (WN). The heating pattern 125 may be formed on the sidewalls of the first graphene pattern 123 in a ring shape as illustrated in FIG. 1.

The insulating layer 127 may be buried inside the ring-shaped heating pattern 125.

The phase-change material pattern 130 may be formed by forming a phase-change material layer on the second interlayer insulating layer 113B and the lower electrode 120, and etching the phase-change material layer using a hard mask (not shown) as an etch barrier. The phase-change material layer may be a chalcogenide-base material such as GST (Ge—Sb—Te).

The upper electrode 140 is formed on the phase-change material pattern 130.

Figure 2:
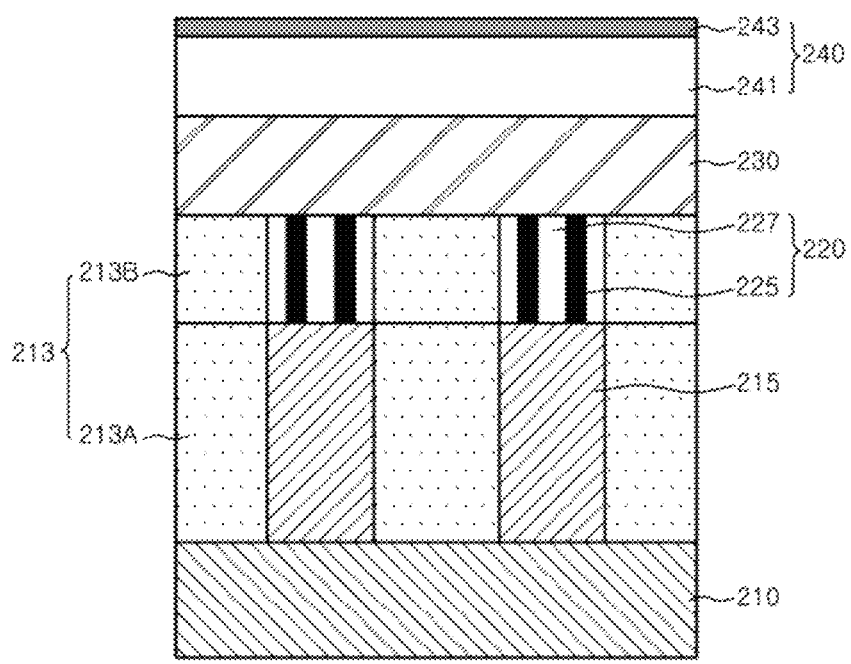
FIG. 2 is a cross-sectional view illustrating a semiconductor device according to an exemplary embodiment of the inventive concept.

FIG. 2 is a cross-sectional view illustrating a semiconductor device according to an exemplary embodiment of the inventive concept.

Referring to FIG. 2, the semiconductor device according to the exemplary embodiment of the inventive concept includes a semiconductor substrate 210 in which a lower structure including a word line (not shown) and a switching device 215 is formed, and a lower electrode 220, a data storage layer such as a phase-change material pattern 230, and an upper electrode 240, which are sequentially formed on the switching device 215.

The lower electrode 220 may be disposed in a hole formed by patterning an interlayer insulating layer 213 formed on the semiconductor substrate 210 and the switching device 215. In the exemplary embodiment, the interlayer insulating layer 213 may include a first interlayer insulating layer 213A and a second interlayer insulating layer 213B formed on the first interlayer insulating layer 213A, and the hole is formed in the second interlayer insulating layer 213B. A top surface of the switching device 215 is exposed by the hole.

The lower electrode 220 may be formed on the switching device 215 and include a heating pattern 225 and an insulating layer 227. The heating pattern 225 may be formed of a material having high electrical conductivity and high thermal conductivity such as TiW, TiAlN, TiN, and WN, and formed to fill the hole in a ring shape as illustrated in FIG. 2. The insulating layer 227 is buried in inside and outside the heating pattern 225.

The phase-change material pattern 230 may be formed by forming a phase-change material layer on the second interlayer insulating layer 213B and the lower electrode 220, and etching the phase-change material layer using a hard mask (not shown) as an etch barrier. The phase-change material layer may be a chalcogenide-base material such as GST (Ge—Sb—Te).

The upper electrode 240 may be formed of an electrode structure including a second metal pattern 241 formed on the phase-change material pattern 230, and a graphene pattern 243 formed on the second metal pattern 241.

The second metal pattern 241 may be formed of a copper (Cu) material having excellent electrical conductivity and low resistance like the first metal pattern 221.

The second graphene pattern 243 may be formed by forming a graphene layer on the second metal pattern 241 of the Cu material by a CVD method. The upper electrode 240 including the second graphene pattern 243 has a current threshold density higher than a metal pattern only including a Cu material, and thus metal resistance may be reduced.

Figure 3:
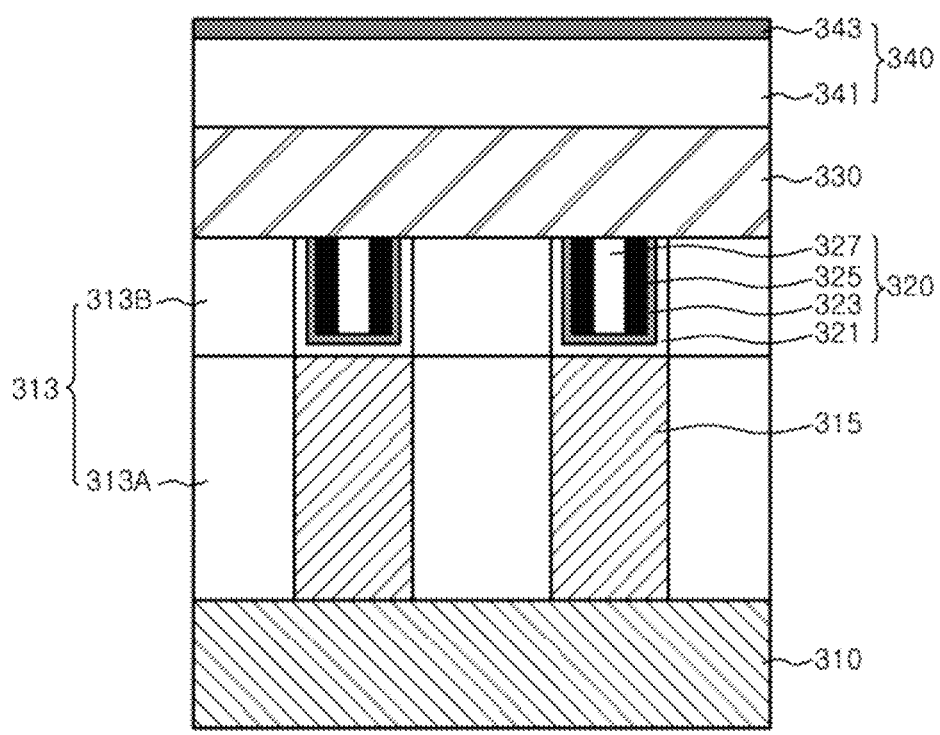
FIG. 3 is a cross-sectional view illustrating a semiconductor device according to an exemplary embodiment of the inventive concept.

FIG. 3 is a cross-sectional view Illustrating a semiconductor device according to an exemplary embodiment of the inventive concept.

Referring to FIG. 3, the semiconductor device according to the exemplary embodiment of the inventive concept includes a semiconductor substrate 310 in which a lower structure including a word line (not shown) and a switching device 315 is formed, and a lower electrode 320, a data storage layer such as a phase-change material pattern 330, and an upper electrode 340, which are sequentially formed on the switching device 315.

The lower electrode 320 of FIG. 3 is substantially the same as the lower electrode 120 of FIG. 1, the upper electrode 340 of FIG. 3 is the same as the upper electrode 240 of FIG. 2, and thus detailed description thereof will be omitted.

Hereinafter, a method of fabricating a semiconductor device according to an exemplary embodiment of the inventive concept will be described. The method of fabricating a semiconductor device will be described by exemplifying the semiconductor device according to the exemplary embodiment of FIG. 3.

FIGS. 4A to 4G are cross-sectional views illustrating a method of fabricating the semiconductor device of FIG. 3 according to an exemplary embodiment of the inventive concept.

Figure 4A:
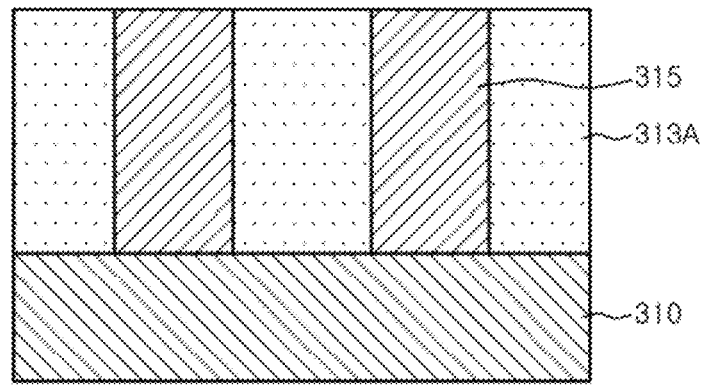
FIGS. 4A to 4G are cross-sectional views illustrating a method of fabricating the semiconductor device of FIG. 3 according to an exemplary embodiment of the inventive concept.

Referring to FIG. 4A, a semiconductor substrate 310 including a lower structure having switching devices 315 is provided. A first interlayer insulating layer is formed to fill spaces between the switching devices 315, and the first interlayer insulating layer is planarized to expose a top surface of the switching device 315. (Hereinafter, the planarized first interlayer insulating layer is referred to as a 'first interlayer insulating layer 313A'.)

Figure 4B:
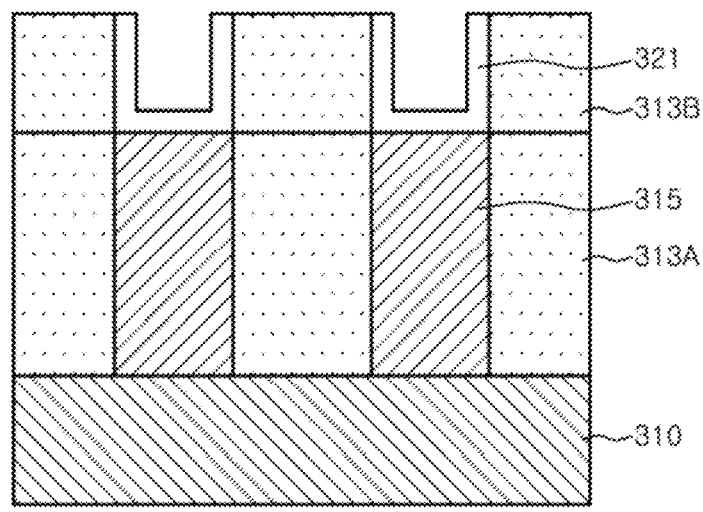

Referring to FIG. 4B, a first metal pattern 321 is formed on the switching device 315. The first metal pattern 321 may be formed of a Cu material having excellent electrical conductivity and excellent thermal conductivity.

The first metal pattern 321 of the Cu material may be formed by a damascene process.

Specifically, a second interlayer insulating layer is formed on the entire surface of the resultant structure including the first interlayer insulating layer 313A, and patterned to form a lower electrode contact hole exposing the top surface of the switching device 315 using a hard mask (not shown) as an etch mask. (Hereinafter, the patterned second interlayer insulating layer is referred to as a 'second interlayer insulating layer 313B'.) A metal layer, that is, a Cu layer is deposited along the entire surface of the resultant structure including the patterned second interlayer insulating layer 313B without filling the lower electrode contact hole, and the Cu layer is etched by a chemical mechanical polishing (CMP) process until a surface of the second interlayer insulating layer 313B is exposed. As a result, the first metal pattern 321 formed along a surface of the lower electrode contact hole on the switching device 315 is formed.

In other words, the first metal pattern 321 may be provided in a top-opened cylindrical shape in the lower electrode contact hole formed by patterning the second interlayer insulating layer 313B.

Figure 4C:
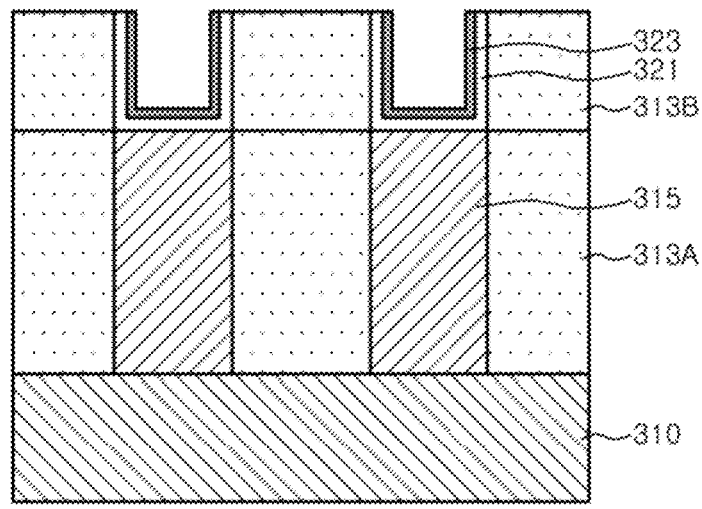

Referring to FIG. 4C, a first graphene pattern 323 may be formed along a surface of the first metal pattern 321 by a CVD method. The first graphene pattern 323 is formed in a top-opened cylindrical shape to provide a shape that substantially confines a heating pattern 325 to be formed in a subsequent process. In other words, the first graphene pattern 323 may be in direct contact with the heating pattern 325 to be formed therein.

The first graphene pattern 323 may be formed by reacting the first metal pattern 321 of the Cu layer with a mixed gas of methane ($CH_4$) and hydrogen ($H_2$) at a high temperature of about 1000° C. using the first metal pattern 321 of the Cu layer as a catalyst layer to allow an appropriate amount of carbon to be dissolved in or adsorbed on the Cu layer. Carbon atoms contained in the Cu layer is crystallized in a surface of the first metal pattern 321 by cooling the Cu layer to form a graphene crystalline structure.

The number of graphene layers in the first graphene pattern 323 may be controlled by controlling a kind and a thickness of a catalyst, a reaction time, cooling speed, a concentration of a reaction gas, and the like. In other words, the first graphene pattern 323 may be formed of at least one layer.

Figure 4D:
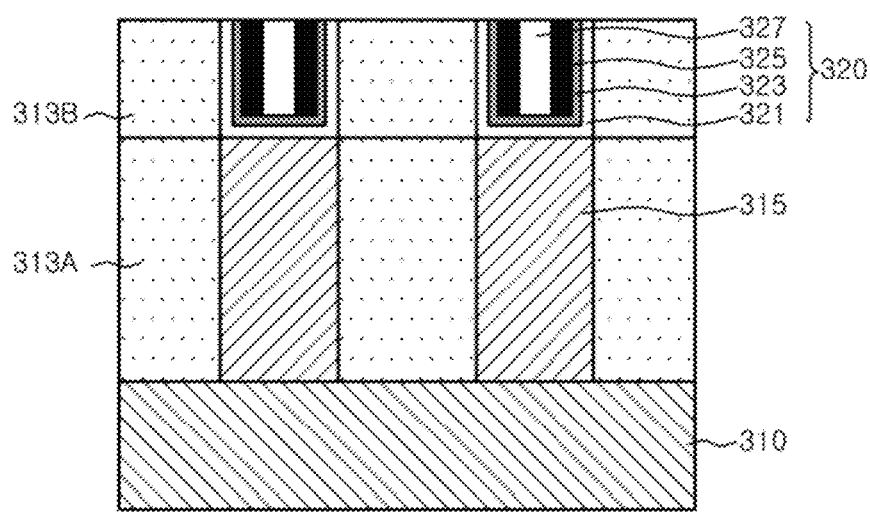

Referring to FIG. 4D, the heating pattern 325 is formed on sidewalls of the first graphene pattern 323 in a ring shape. The heating pattern 325 may be formed by burying a conductive material in the first graphene pattern 323 having the top-opened cylindrical shape, and performing an anisotropic blanket etching process thereon. The conductive material may be formed of a material having high electrical conductivity and high thermal conductivity such as TiW, TiAlN, TiN, and WN.

After the heating pattern 325 may remain only on the sidewalls of the first graphene pattern 323, an insulating layer 327 may be buried in the heating pattern 325 having the ring shape. Therefore, a lower electrode 320 including the first metal pattern 321, the first graphene pattern 323, the heating pattern 325, and the insulating layer 327 is formed as illustrated in FIG. 4D.

In the exemplary embodiment of the inventive concept, the first graphene pattern 323 formed of a material having higher thermal conductivity than the heating pattern 325 is provided in a shape confining the heating pattern 325 so that the first graphene pattern 323 induces Joule heat generated in an interface between the heating pattern 325 and a phase-change material pattern (see 330 of FIG. 4E) not to be distributed but to be mostly emitted toward the switching device 315 therebelow quickly.

Thus, the Joule heat generated in a selected cell is mostly induced quickly toward the switching device 315 in the lower structure and is not transferred to the phase-change material pattern 330 of an adjacent cell, so that thermal disturbance between cells is not caused.

Since the Joule heat generated in the selected cell is mostly induced quickly toward the switching device 315 in the lower structure, a reset current required in cooling the phase-change material pattern 330 quickly may be reduced using a pulse.

Figure 4E:
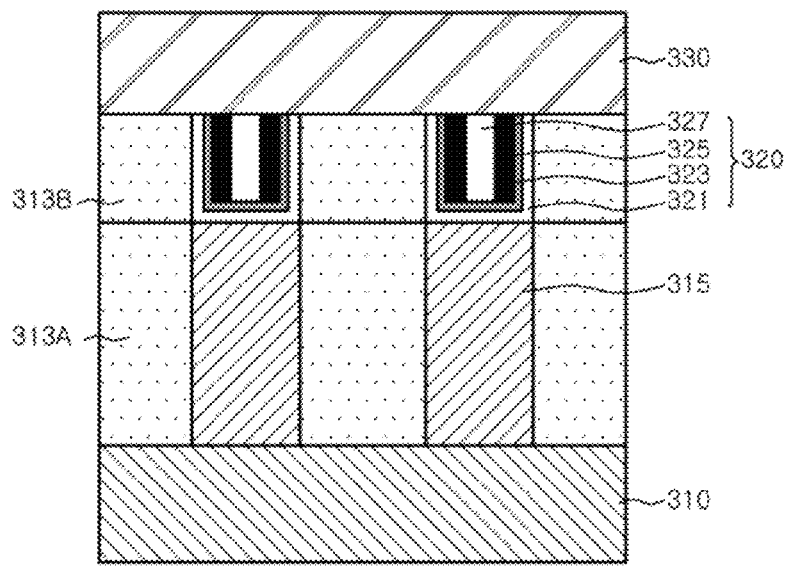

Referring to FIG. 4E, a data storage layer such as the phase-change material pattern 330 is formed on the second interlayer insulating layer 313B and the lower electrode 320 including the first metal pattern 321, the first graphene pattern 323, the heating pattern 325, and the insulating layer 327.

Figure 4F:
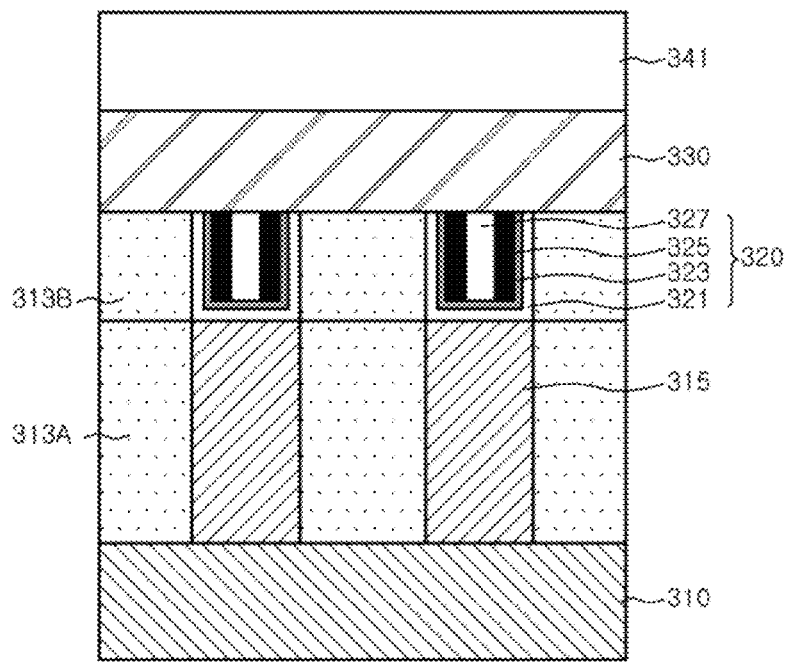

Referring to FIG. 4F, a second metal pattern 341 is formed on the phase-change material pattern 330. The second metal pattern 341 may be formed of a Cu material having excellent electrical conductivity and excellent thermal conductivity by a damascene process like the first metal pattern 321.

Figure 4G:
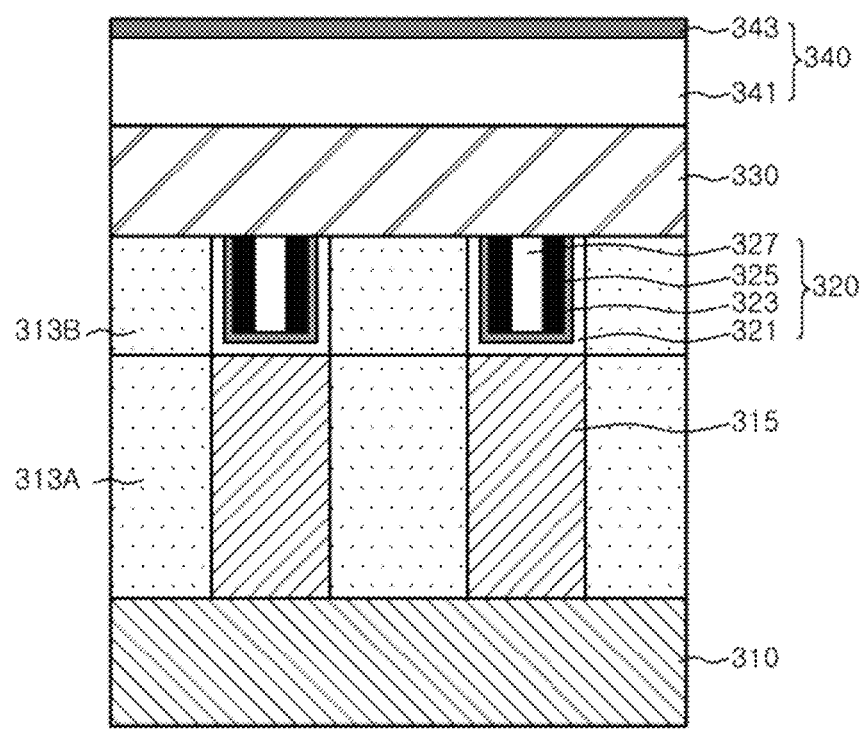

Referring to FIG. 4G, a second graphene pattern 343 is formed on the second metal pattern 341 using a CVD method. Accordingly, an upper electrode 340 including the second metal pattern 341 and the second graphene pattern 343 is formed.

The upper electrode 340 including the second graphene pattern 343 has a current threshold density higher than a metal pattern only including a Cu material to reduce metal resistance.

In the PCRAM, when the upper electrode 340 is formed, the second graphene pattern 343 is formed on the second metal pattern 341 formed of the Cu material to reduce total resistance of the upper electrode 340.

The exemplary embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A semiconductor device comprising:
   a data storage layer formed over a semiconductor substrate in which a lower structure is formed; and
   an electrode structure formed on at least one side of the data storage layer over the semiconductor substrate,
   wherein the data storage layer includes a phase-change material pattern, and
   the electrode structure includes a lower electrode disposed below the data storage layer,
   wherein the lower electrode includes:
      a heating pattern suitable for contacting the phase-change material pattern, and generating a heat when current flows;
      a metal pattern provided in a shape to confine the heating pattern; and
      the graphene pattern interposed between the metal pattern and the heating pattern.

2. The semiconductor device of claim 1, wherein the metal pattern includes a copper (Cu) material, and
   the graphene pattern is formed over the metal pattern of the Cu material by a chemical vapor deposition (CVD) method.

3. The semiconductor device of claim 1, wherein the metal pattern and the graphene pattern are formed in a cylindrical shape in which a top at a side in contact with the phase-change material pattern is opened.

4. The semiconductor device of claim 1, wherein the electrode structure further include an upper electrode disposed on the data storage layer.

5. The semiconductor device of claim 4, wherein the upper electrode includes:
   a second metal pattern formed over the data storage layer; and
   a second graphene pattern formed over the second metal pattern.

* * * * *